(12) United States Patent
Filippi et al.

(10) Patent No.: US 9,082,781 B2
(45) Date of Patent: Jul. 14, 2015

(54) SEMICONDUCTOR ARTICLE HAVING A ZIG-ZAG GUARD RING AND METHOD OF FORMING THE SAME

(71) Applicant: International Business Machines Corporation, Armonk, NY (US)

(72) Inventors: Ronald G. Filippi, Wappingers Falls, NY (US); Erdem Kaltalioglu, Newburgh, NY (US); Xiao Hu Liu, Briarcliff Manor, NY (US); Thomas M. shaw, Peekskill, NY (US); Ping-Chuan Wang, Hopewell Junction, NY (US); Bucknell C. Webb, Yorktown Heights, NY (US); Lijuan Zhang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/045,145

(22) Filed: Oct. 3, 2013

(65) Prior Publication Data

US 2015/0097297 A1    Apr. 9, 2015

(51) Int. Cl.
*H01L 23/48* (2006.01)
*H01L 23/00* (2006.01)
*H01L 23/538* (2006.01)

(52) U.S. Cl.
CPC .......... *H01L 23/564* (2013.01); *H01L 23/5384* (2013.01); *H01L 23/5386* (2013.01)

(58) Field of Classification Search
CPC ....... H01L 23/481; H01L 23/52; H01L 29/40; H01L 2924/01079; H01L 23/5226
USPC ................... 257/758, 774, E23.145; 438/637
See application file for complete search history.

(56) References Cited

U.S. PATENT DOCUMENTS

| 5,347,086 | A  | 9/1994  | Potter et al. |
| 6,181,551 | B1 | 1/2001  | Herman et al. |
| 6,429,502 | B1 | 8/2002  | Librizzi et al. |
| 6,710,258 | B2 | 3/2004  | Oggioni et al. |
| 7,138,700 | B2 | 11/2006 | Tomita et al. |
| 7,170,144 | B2 | 1/2007  | Hsu |
| 7,276,787 | B2 | 10/2007 | Edelstein et al. |
| 7,516,879 | B1 | 4/2009  | Buchwalter et al. |

(Continued)

FOREIGN PATENT DOCUMENTS

| JP | 2003078138 A | 3/2003 |
| JP | 2012064715 A | 3/2012 |
| KR | 2011006946 A | 1/2011 |

OTHER PUBLICATIONS

Hu, Sanming, et al., "A Thermal Isolation Technique Using Through-Silicon Vias for Three-Dimensional ICs", Electron Devices, IEEE Transactions on 60, No. 3 (2013): 1282-1287.

(Continued)

*Primary Examiner* — Phuc Dang
(74) *Attorney, Agent, or Firm* — Catherine Ivers

(57) ABSTRACT

A semiconductor article which includes a semiconductor base portion including a semiconductor material; a back end of the line (BEOL) wiring portion on the semiconductor base portion and comprising a plurality of wiring layers having metallic wiring and insulating material, said BEOL wiring portion excluding a semiconductor material; and a guard ring in the BEOL wiring portion and surrounding a structure in the semiconductor chip, the guard ring having a zig-zag configuration.

19 Claims, 9 Drawing Sheets

(56) References Cited

U.S. PATENT DOCUMENTS

| | | | |
|---|---|---|---|
| 7,525,186 | B2 | 4/2009 | Kim et al. |
| 7,547,572 | B2 | 6/2009 | Carson et al. |
| 7,573,130 | B1 | 8/2009 | Shaw et al. |
| 7,633,167 | B2 | 12/2009 | Kawano et al. |
| 8,232,648 | B2 * | 7/2012 | McGahay et al. ............ 257/758 |
| 8,330,253 | B2 * | 12/2012 | Tomita ........................... 257/620 |
| 2010/0038800 | A1 | 2/2010 | Yoon et al. |
| 2010/0133696 | A1 | 6/2010 | Chen et al. |
| 2011/0260330 | A1 | 10/2011 | Seo et al. |
| 2011/0300708 | A1 | 12/2011 | Kuo |

OTHER PUBLICATIONS

Yoon, Kihyun et al., "Modeling and analysis of coupling between TSVs, metal, and RDL interconnects in TSV-based 3D IC with silicon interposer", In Electronics Packaging Technology Conference, 2009. EPTC'09. 11th, pp. 702-706. IEEE, 2009.

Prosecution History, U.S. Appl. No. 12/791,398, Office Action dated Dec. 15, 2011, all pages.

Prosecution History, U.S. Appl. No. 12/791,398, Amendment to Office Action dated Mar. 19, 2012, all pages.

Prosecution History, U.S. Appl. No. 12/791,398, Notice of Allowance dated May 22, 2012, all pages.

* cited by examiner

SEMICONDUCTOR ARTICLE HAVING A ZIG-ZAG GUARD RING AND METHOD OF FORMING THE SAME

BACKGROUND

Semiconductor devices or chips (hereafter referred to as just "chips") may consist of a semiconductor base where all of the front end of the line (FEOL) processing is typically done to form the semiconductor transistors, capacitors, etc. and a back end of the line (BEOL) wiring where multiple wiring layers are formed to connect the various transistors, capacitors, etc. in the semiconductor base. The BEOL wiring may also have input/output (I/O) pads for connecting the chip to a next level of packaging such as a plastic laminate or a ceramic substrate. The semiconductor base is made from a semiconductor material while the BEOL wiring is made from metallic materials for wiring and dielectric material for insulation. The BEOL wiring does not contain semiconductor materials.

Current semiconductor chips may have a through silicon via which partially or entirely extends through the semiconductor base and the BEOL wiring. Such a through silicon via may be used, for example, to connect two chips by stacking them one on top of the other and having the through silicon via extending between the two chips.

BRIEF SUMMARY

The various advantages and purposes of the exemplary embodiments as described above and hereafter are achieved by providing, according to a first aspect of the exemplary embodiments, a semiconductor article including a semiconductor base portion including a semiconductor material; a back end of the line (BEOL) wiring portion on the semiconductor base portion and comprising a plurality of wiring layers having metallic wiring and insulating material, said BEOL wiring portion excluding a semiconductor material; and a guard ring in the BEOL wiring portion and surrounding a structure in the semiconductor chip, the guard ring having a zig-zag configuration.

According to a second aspect of the invention, there is provided a method of forming a semiconductor article which includes the steps of: (a) providing a semiconductor base portion comprising a semiconductor material; (b) forming a back end of the line (BEOL) wiring layer comprising a metallic material and a dielectric material and excluding a semiconductor material, the BEOL wiring layer comprising a contiguous guard ring portion which includes a plurality of via bar segments such that every two via bar segments are joined at a vertex and the angle between the every two via bar segments is less than 90 degrees, the guard ring portion having a zig-zag configuration; and (c) repeating step (b) until a predetermined number of BEOL wiring layers have been formed into a BEOL wiring portion with each contiguous guard ring portion being formed over, and in contact with, a previous contiguous guard ring portion to form a guard ring extending through the entire BEOL wiring portion, the guard ring portion on each BEOL wiring layer having a zig-zag configuration.

BRIEF DESCRIPTION OF SEVERAL VIEWS OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

The present invention is directed to a zig-zag guard ring that in one exemplary embodiment surrounds a through silicon via. In another exemplary embodiment, the zig-zag guard ring surrounds a semiconductor chip. The guard ring performs no electrical function and is meant to perform as a barrier to moisture and metal diffusion from the through silicon via as well as inhibit crack propagation.

Figure 1A:
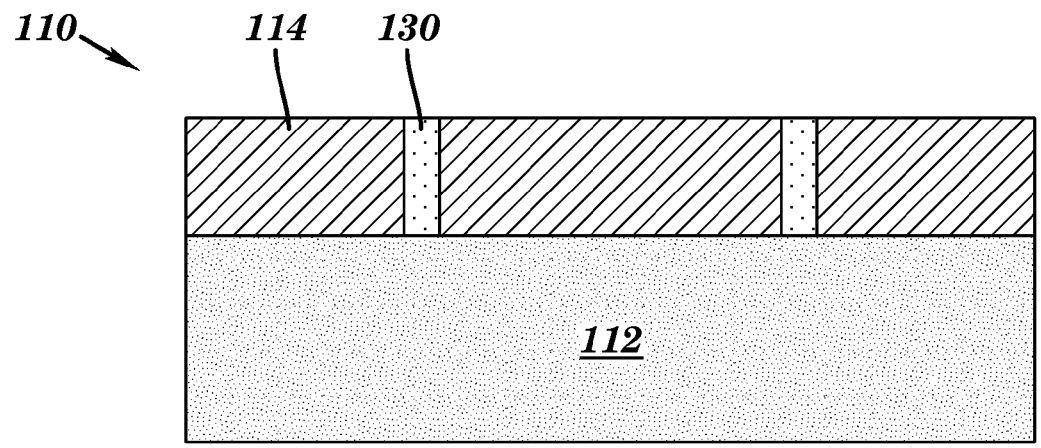
FIGS. 1A to 1D are cross sectional views illustrating a first exemplary embodiment of forming a through silicon via and a zig-zag guard ring in a semiconductor chip and the inventive semiconductor article having the zig-zag guard ring.

Referring to the Figures in more detail, FIGS. 1A to 1D, a first embodiment of the present invention is illustrated. Referring first to FIG. 1A, a semiconductor chip 110 includes a semiconductor base 112 and back end of the line (BEOL) wiring 114. For clarity, the semiconductor base 112 is not shown in cross section. It is to be understood that only a portion of semiconductor chip 110 is shown in FIGS. 1A to 1D. Some suitable materials for semiconductor base 112 include but are not limited to group IV semiconductors such as silicon, silicon germanium or germanium, a III-V compound semiconductor, or a II-VI compound semiconductor. The BEOL wiring 114 includes multiple layers (not shown) of metallic wiring with an insulating dielectric material. The metallization of the BEOL wiring 114 is usually copper but can also be aluminum in the upper layers. The insulation of BEOL wiring 114 may be any suitable material such as silicon dioxide, silicon nitride, or SiCOH (a compound consisting of silicon, carbon, oxygen and hydrogen). A particularly preferred material is a low dielectric constant (low-k) material.

During processing of the BEOL layers, there may be damage from chemical attack and thermo-mechanical stress. In addition, wet clean processes may cause moisture ingress to the BEOL low-k dielectric material. In one exemplary embodiment, the BEOL layers that are susceptible to process damage and moisture ingress are sealed by a guard ring.

The semiconductor base 112 has undergone front end of the line (FEOL) processing to form the various individual devices such as transistors, capacitors and the like. Such individual devices are not shown for clarity. The BEOL wiring 114 includes multiple layers (not shown) of metallic wiring with an insulating dielectric material. The precise details of BEOL wiring 114 are well known to those skilled in the art and need not be shown here. Also shown in FIG. 1A is guard ring 130 which may be formed when the individual wiring layers of BEOL wiring 114 are formed. The formation of guard ring 130 will be discussed in more detail hereafter. In one preferred embodiment of the present invention, the guard ring 130 is a ring or fence of metallic material that encloses the area where the through silicon via will be formed.

Figure 1B:
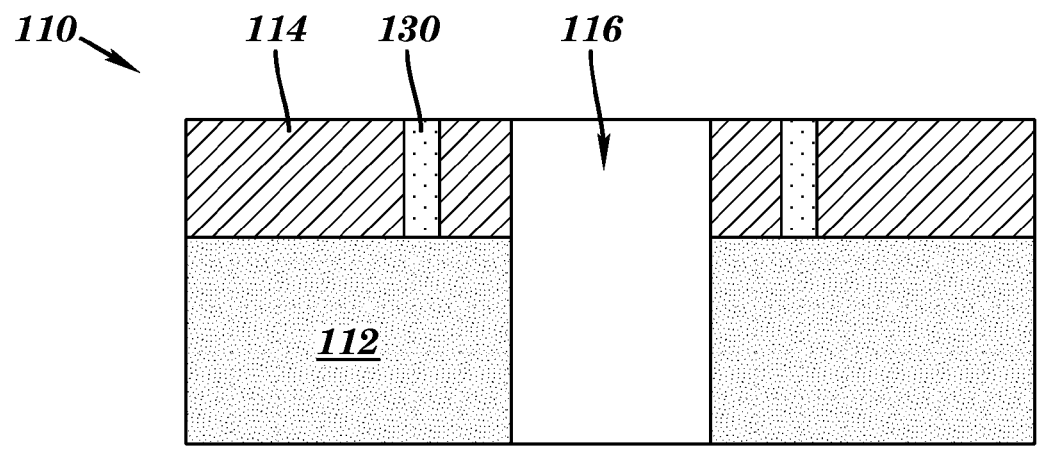
Figure 1C:
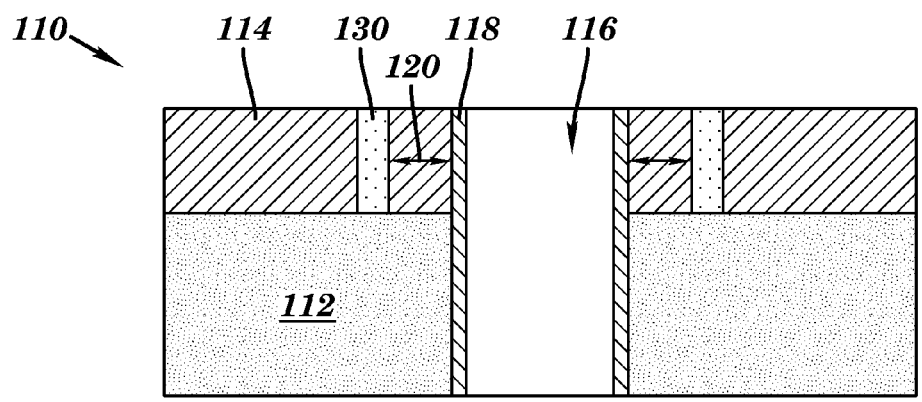

Shown in FIG. 1B is a through silicon via opening 116 which has been conventionally etched through the BEOL wiring 114 and semiconductor base 112. The location of the through silicon via opening 116 has been chosen so as to be within the guard ring 130. Guard ring 130 extends either partially or to the entire vertical length of the through silicon via in the BEOL wiring 114. While through silicon via opening 116 is shown as being etched entirely though the BEOL wiring 114 and semiconductor base 112, it is within the scope of the present invention for through silicon via opening 116 to be etched only partially through the BEOL wiring 114 and/or semiconductor base 112.

An insulating material 118 may then be deposited on the walls of the through silicon via opening 116. In one conventional process for depositing the insulating material 118, sub-atmospheric chemical vapor deposition (SACVD) or plasma enhanced chemical vapor deposition (PECVD) oxide/tetra-ethyl orthosilicate (TEOS) may be used. The insulating material 118 may have a thickness of about 1 um. A byproduct of the formation of the insulating material 118 is the production of water which can migrate into the dielectric material of the BEOL wiring 114, as indicated by arrows 120 shown in FIG. 1C. As noted above, moisture can be detrimental to the insulating material of the BEOL wiring 114, particularly where the insulating material comprises a so-called low dielectric constant (low-k) material. However, the guard ring 130 blocks any water that may be present from entering the insulating material of the BEOL wiring 114. The small volume of insulating material between the through silicon via opening 116 and guard ring 130 may be essentially nonfunctional so the presence of moisture here is not detrimental to the semiconductor chip 110.

Figure 1D:
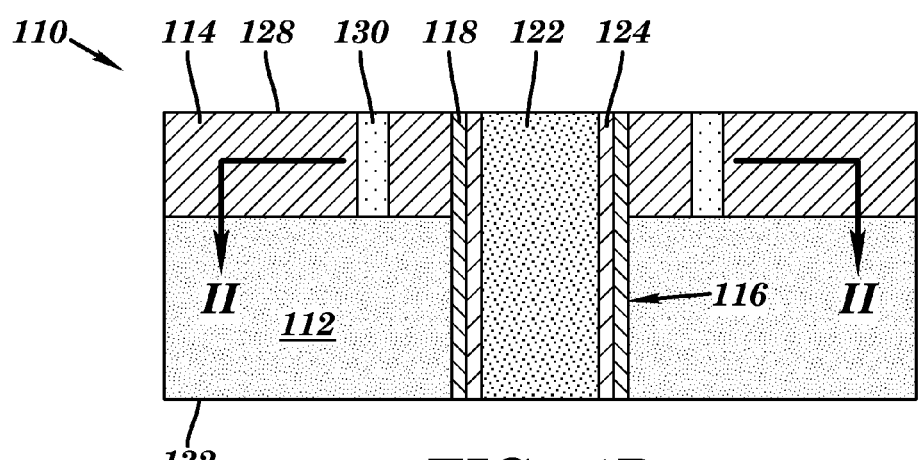

Next, the through silicon via opening 116 is metallized by conventionally depositing a metallic material 122, such as copper, into the through silicon via opening 116 as shown in FIG. 1D. The through silicon via opening 116 may also include a conventional liner layer 124, such as tantalum (Ta)/tantalum nitride (TaN). The liner layer may have a thickness of about 10 nm-100 nm. In another embodiment of the present invention, the liner layer 124 may be dispensed with since any migration of the metallization 122 into the functional portion of the BEOL wiring 114 would be prevented by the guard ring 130.

The metallized through silicon via 116, as shown in FIG. 1D, may extend through all of the BEOL wiring 114 and the semiconductor base 112. In other embodiments of the present invention, the metallized through silicon via 116 may extend only partially through the BEOL wiring 114 and/or the semiconductor base 112.

It is to be noted that the metallized through silicon via 116 may extend continuously through the BEOL wiring 114 and semiconductor base 112. By "continuously", it is meant that the metallized through silicon via 116 extends through the semiconductor chip 110 from or near surface 128 of the BEOL wiring 114 to or near surface 132 of the semiconductor base 112 in a straight path without any jogs to the side.

Figure 2A:
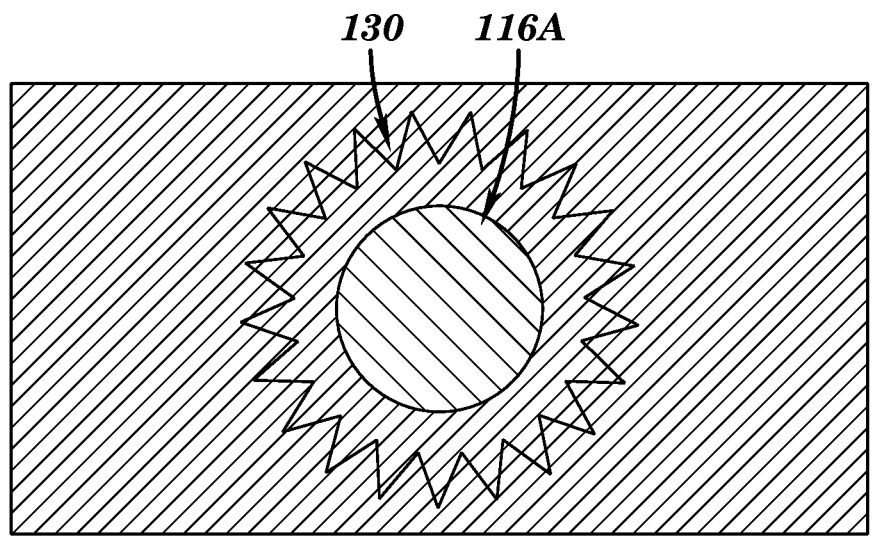
FIGS. 2A and 2B are cross sectional views in the direction of arrows II-II in FIG. 1D illustrating various embodiments of the zig-zag guard ring according to the present invention, showing the zig-zag guard ring in plan view.
Figure 2B:
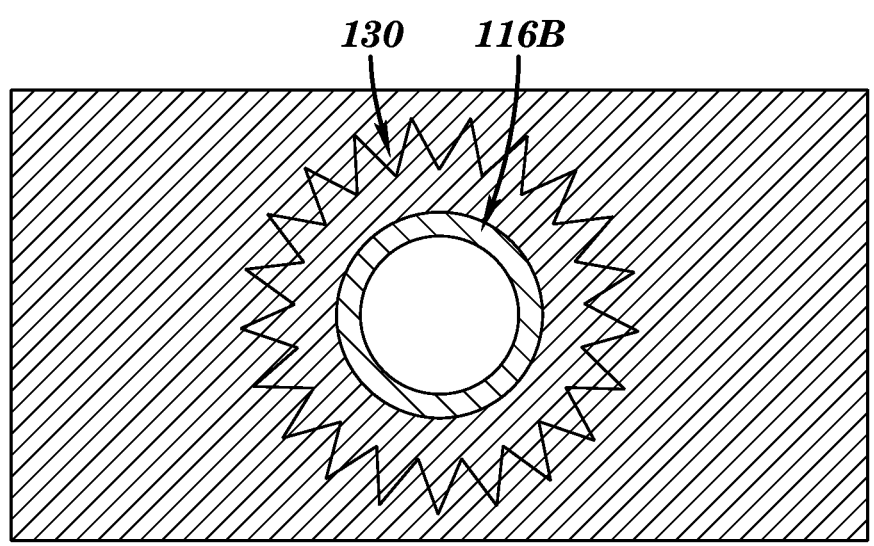

The guard ring 130 may be formed in a zig-zag configuration as shown in plan view in FIGS. 2A and 2B. A zig-zag configuration may be defined as a series of short, sharp angles in alternate directions. Metallized through silicon via 116A may be solid as shown in FIG. 2A or may be hollow in the center (formed as annulus) as shown in FIG. 2B. The individual layers of metallized through silicon via 116 are not shown for clarity.

Figure 3:
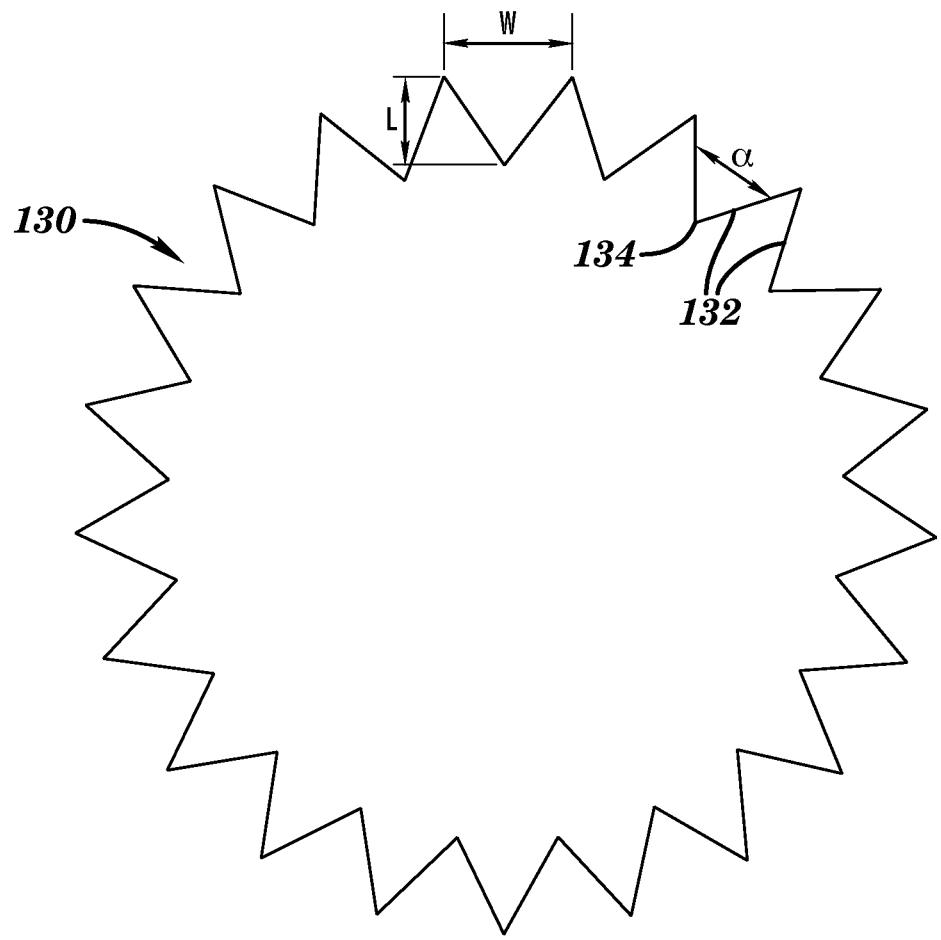
FIG. 3 is an enlarged plan view of the zig-zag guard ring.

Referring now to FIG. 3, the zig-zag guard ring 130 is shown in greater detail. The zig-zag guard ring 130 comprises a plurality of via bars 132 which intersect at a series of vertices 134. Each pair of intersecting via bars 132 form a "V" shape. The "V" shape alternates in orientation (i.e., up, down, up, down, etc.) around the circumference of the guard ring 130. The via bars intersect at each vertex 134 at an angle $\alpha$. It is preferred that angle $\alpha$ should be less than 90 degrees. The arrangement of the via bars 132 should be such as to form a plurality of long arms to increase bending moment at each via bar 132. In this regard, the zig-zag guard ring should have a width "W" between vertices 134 and a length "L" measured from each vertex to a line extending from an adjacent vertex (essentially the depth of each "V" shape), as shown in FIG. 3, such that $L/W > \frac{1}{2}$. Depending on the size and number of levels in BEOL wiring 114 in FIG. 1, the width of each via bar 132 can be from tens to hundreds of nanometers (nm) and the length of each via bar 132 can be typically 10 times the maximum width of each via bar 132 in all the levels of the BEOL wiring 114 in FIG. 1.

Figure 8:
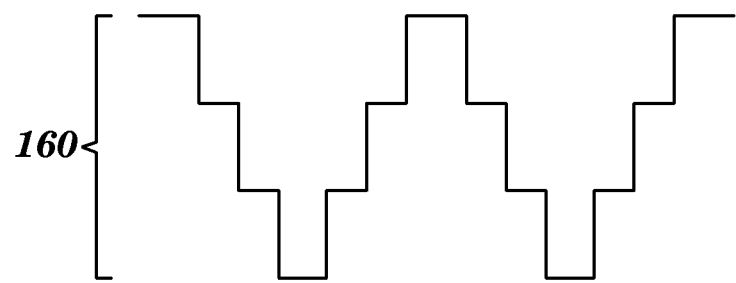
FIG. 8 is a plan view of a guard ring segment in which the via bars themselves are in a zig-zag pattern.

While the via bars 132 shown in FIG. 3 are straight line segments, each of the via bars 132 may themselves be in a non-linear configuration such as a zig-zag line. FIG. 8 shows an embodiment of a guard ring segment in the shape of a "W" but the via bars 160 are in a zig-zag configuration instead of a straight line.

The dimensions of the zig-zag guard ring 130 and metallized through silicon via 116 may vary depending on the design requirements of the semiconductor chip. In an example of one embodiment, for purposes of illustration and not limitation, the metallized through silicon vias 116 may have an outside diameter of about 20 micro-meters (μm) and the guard ring 130 may have an outside dimension of about 25 um.

The method of forming a semiconductor article having a through silicon via and a zig-zag guard ring will be next described with reference to FIG. 4 and FIGS. 5A to 5E. In a first step of the method, a semiconductor base 112 is provided, box 40 in FIG. 4 and FIG. 5A. That is, a semiconductor wafer is prepared with all of the necessary semiconductor devices such as transistors, capacitors and the like. It should be understood that only a portion of the semiconductor wafer is shown in FIG. 5A.

Figure 4:
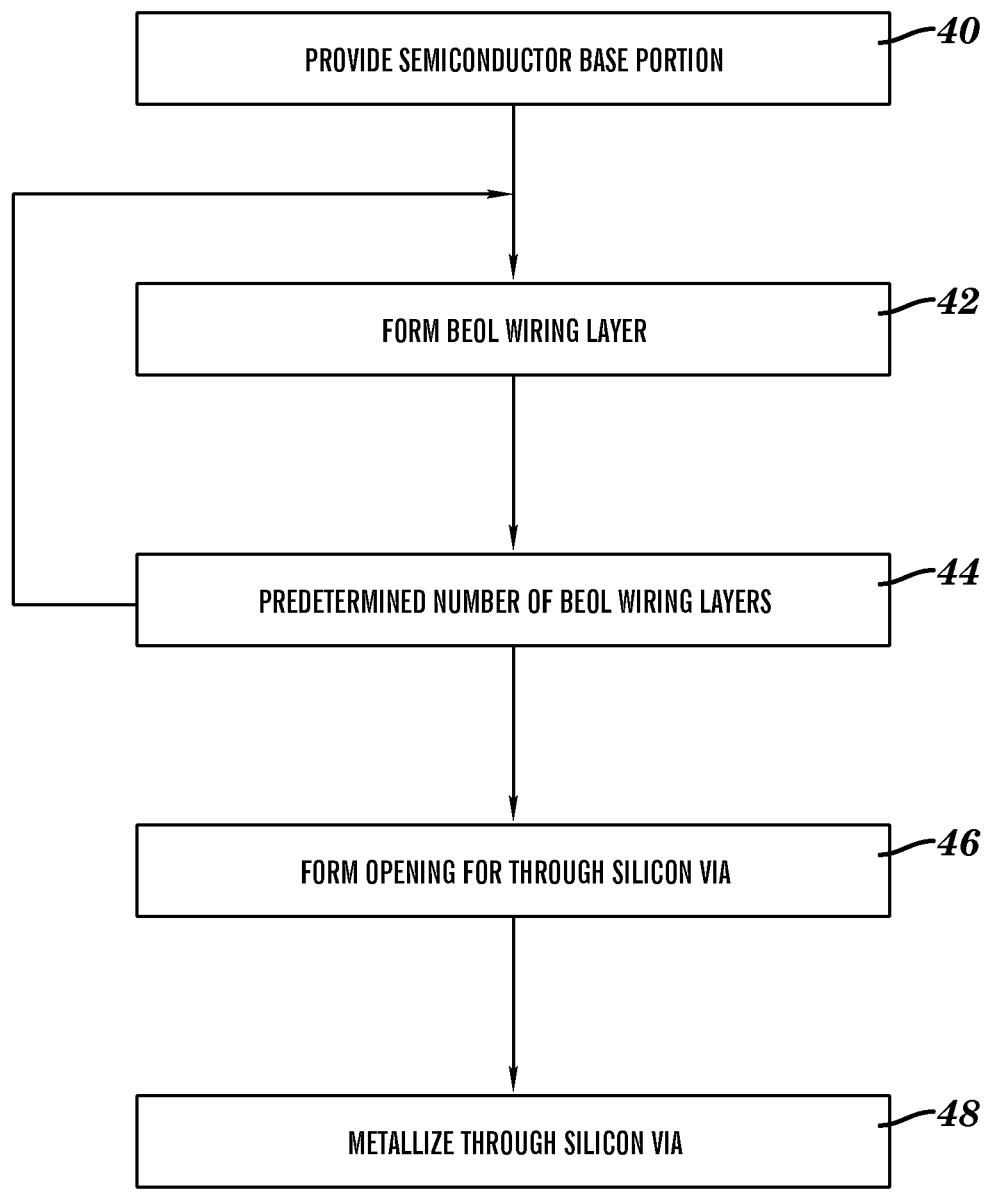
FIG. 4 is a flow chart illustrating the first exemplary embodiment.
Figure 5A:
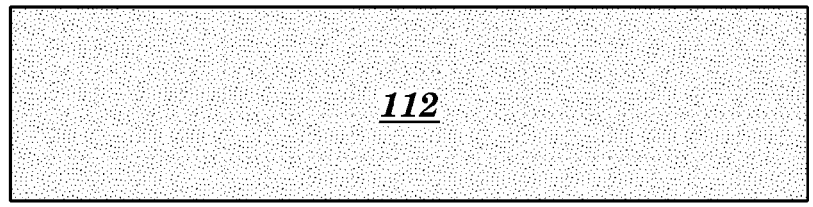
FIGS. 5A to 5E are cross sectional views illustrating formation of the zig-zag guard ring according to a first exemplary embodiment.
Figure 5B:
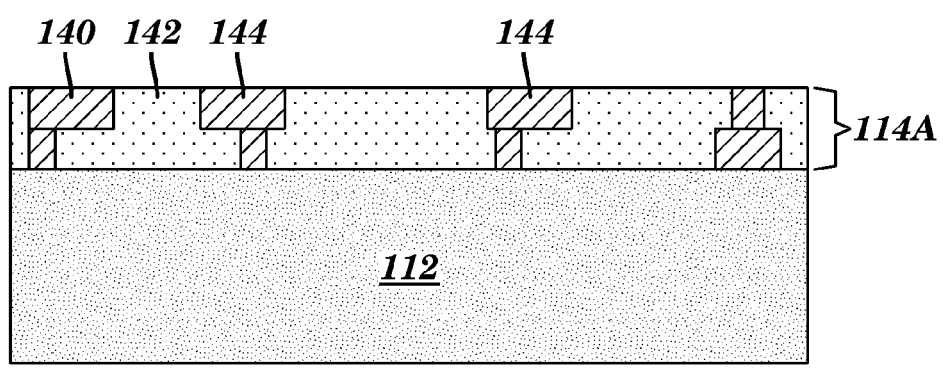

Next a first BEOL wiring layer 114A is formed including metallization 140 and dielectric material 142 as indicated in box 42 of FIG. 4 and in FIG. 5B. It is noted that BEOL wiring layer 114A contains a zig-zag guard ring portion 144 which will perform no electrical function in the BEOL wiring 114. The formation of BEOL wiring layer 114A and all subsequent BEOL wiring layers are by conventional methods.

Figure 5C:
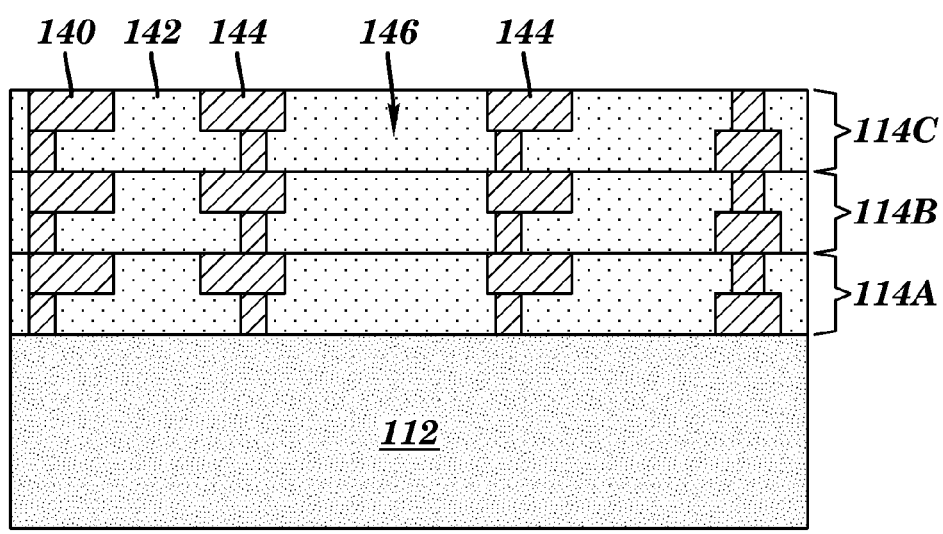

Additional BEOL wiring layers may be formed until a predetermined number of BEOL wiring layers are formed to meet the design requirements of the semiconductor chip, box 44 in FIG. 4 and FIG. 5C. As shown in FIG. 5C, there are only two additional BEOL wiring layers formed, 114B and 114C, but in practice there will usually be more such BEOL wiring layers formed. It is to be noted that the zig-zag guard ring portions 144 of each BEOL wiring layer are stacked on top of the zig-zag guard ring portion 144 of the preceding BEOL wiring layer. The various zig-zag guard ring portions 144 form the zig-zag pattern as discussed above with respect to FIGS. 2A, 2B and 3. Within the zig-zag guard ring portions 144 is an open area 146 where the through silicon via 116 will be formed.

Figure 5D:
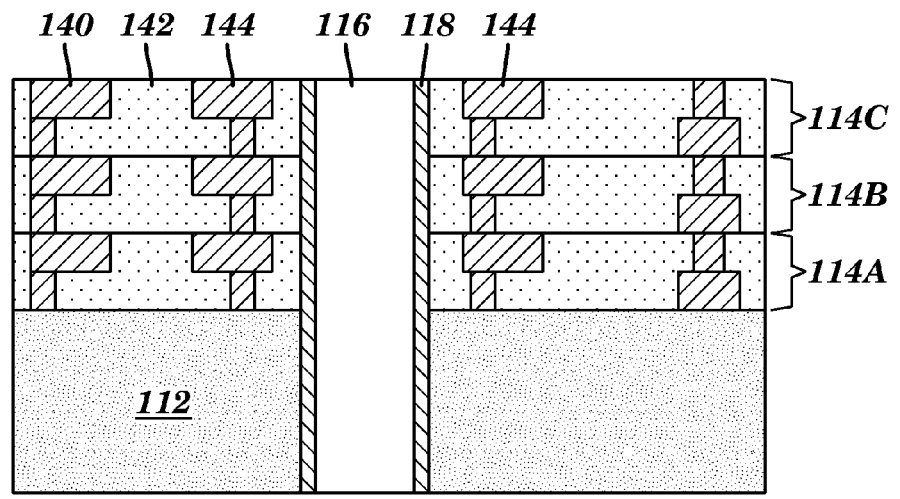

As indicated in box 46 of FIG. 4 and FIG. 5D, the through silicon via 116 is formed in the open area 146 (and within zig-zag guard ring portions 144) and an insulating layer 118 is formed by conventional means.

Figure 5E:
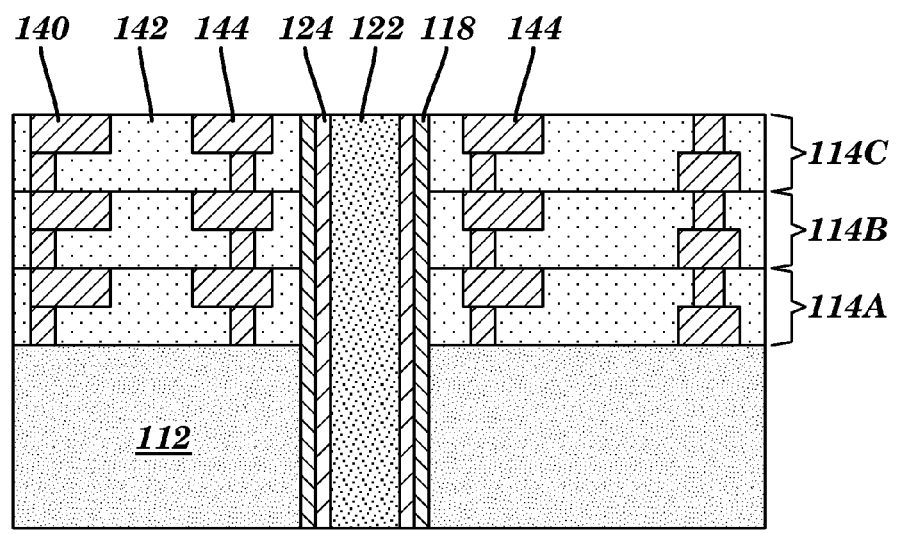

Lastly, the through silicon via 116 is metallized with an optional liner layer 124 and metallization 122, box 48 of FIG. 4 and FIG. 5E. Semiconductor processing then proceeds in a conventional way.

Figure 6:
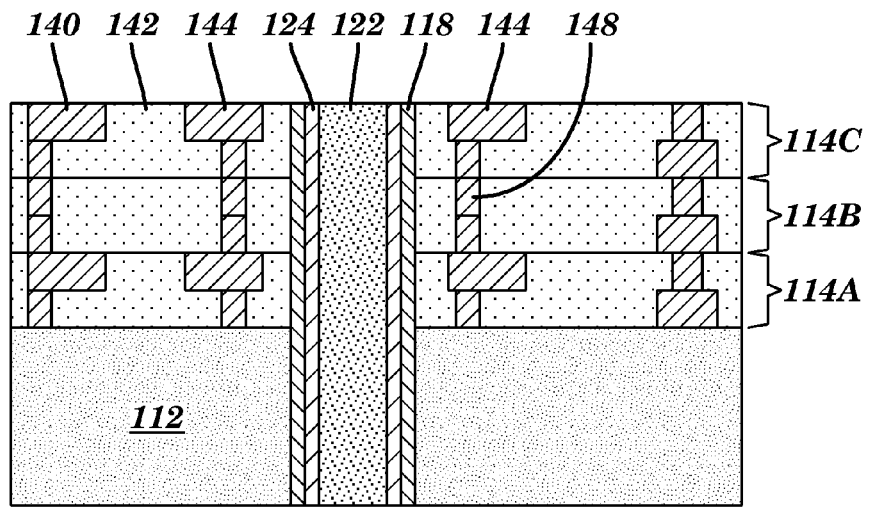
FIG. 6 is a cross sectional view illustrating the guard ring in non-contiguous BEOL wiring layers.

The guard ring portions 144 may be in all or only some of the BEOL wiring layers so that the guard ring 130 extends either partially or to the entire length of the through silicon via 116 in the BEOL wiring 114. Moreover, the guard ring portions 144 need not be in contiguous BEOL wiring layers. One example may be to replicate the guard ring 130 into two parallel guard rings 130. The two guard rings 130 may be connected into one guard ring by metal bars (vias) from the vertex of one guard ring to the vertex of the other guard ring. For example, as shown in FIG. 6, guard ring portions 144 in BEOL wiring layer 114A may form one guard ring 130 while guard ring portions 144 in BEOL wiring layer 114C may form another guard ring 130. Each of these guard rings, not in contiguous BEOL wiring layers, may be connected by vias 148.

Figure 7:
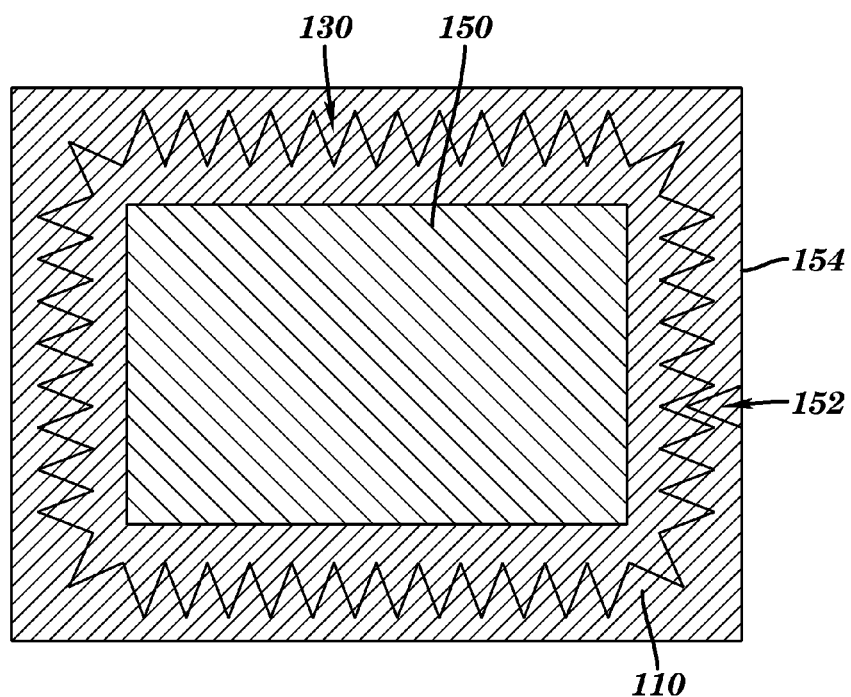
FIG. 7 is a cross sectional view of another exemplary embodiment of a zig-zag guard ring on a semiconductor chip showing the zig-zag guard ring in plan view.

Referring now to FIG. 7, there is disclosed another exemplary embodiment in which the zig-zag guard ring 130 is placed along the periphery of the semiconductor chip 110, preferably in an inactive area of the semiconductor chip 110. The zig-zag guard ring 130 serves to protect the active area 150 of the semiconductor chip 110 from cracks 152 that may emanate from the edge 154 of the semiconductor chip 110.

The zig-zag guard ring 130 shown in FIG. 7 may be made by the process described previously except that there is no need to form the through silicon via.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A semiconductor article comprising:
a semiconductor base portion comprising a semiconductor material;
a back end of the line (BEOL) wiring portion on the semiconductor base portion and comprising a plurality of wiring layers having metallic wiring and insulating material, said BEOL wiring portion excluding a semiconductor material; and
a guard ring in the BEOL wiring portion and surrounding a structure in the semiconductor article, the guard ring having a zig-zag configuration wherein the guard ring comprises a plurality of via bars and the zig-zag configuration is defined as a series of the via bars arranged in short, sharp angles in alternate directions.

2. The semiconductor article of claim 1 wherein the structure comprising a through silicon via providing a conductive path through the BEOL wiring portion and the semiconductor base portion, the guard ring surrounding the through silicon via in the BEOL wiring portion.

3. The semiconductor article of claim 2 wherein the through silicon via through the semiconductor base portion being free of any guard ring.

4. The semiconductor article of claim 2 wherein the guard ring is limited to the BEOL wiring portion.

5. The semiconductor article of claim 2 wherein the semiconductor base portion has a first surface and the BEOL wiring portion has a second surface and the through silicon via continuously extends from the first surface to the second surface.

6. The semiconductor article of claim 2 wherein the guard ring is spaced from the through silicon via.

7. The semiconductor article of claim 2 wherein the through silicon via has a length within the BEOL wiring portion and the guard ring has a length within the BEOL wiring portion such that the length of the guard ring is coextensive with, or less than, the length of the through silicon via.

8. The semiconductor article of claim 1 wherein the guard ring comprises a plurality of solid metallic portions in the BEOL wiring layers that are stacked in the BEOL wiring portion to form a metallic structure surrounding the through silicon via in the BEOL wiring portion.

9. The semiconductor article of claim 1 wherein there are at least two BEOL wiring layers having the guard ring in the zig-zag configuration such that the at least two BEOL wiring layers are separated by at least one BEOL wiring layer that does not have a guard ring.

10. The semiconductor article of claim 9 further comprising a via to connect the guard rings in the at least two BEOL wiring layers, the via extending through the at least one BEOL wiring layer.

11. A semiconductor article comprising:
a semiconductor base portion comprising a semiconductor material;
a back end of the line (BEOL) wiring portion on the semiconductor base portion and comprising a plurality of wiring layers having metallic wiring and insulating material, said BEOL wiring portion excluding a semiconductor material; and
a guard ring in the BEOL wiring portion and surrounding a structure in the semiconductor article, the guard ring having a zig-zag configuration which comprises a plurality of via bar segments such that every two via bar segments are joined at a vertex and the angle between the every two via bar segments is less than 90 degrees.

12. A semiconductor article comprising:
a semiconductor base portion comprising a semiconductor material;
a back end of the line (BEOL) wiring portion on the semiconductor base portion and comprising a plurality of wiring layers having metallic wiring and insulating material, said BEOL wiring portion excluding a semiconductor material; and
a guard ring in the BEOL wiring portion and surrounding a structure in the semiconductor article, the guard ring having a zig-zag configuration, wherein the structure comprising an active area of the semiconductor article, the guard ring being in an inactive area of the semiconductor article along a periphery of the semiconductor article.

13. The semiconductor article of claim 12 wherein the guard ring comprises a plurality of solid metallic portions in the BEOL wiring layers that are stacked in the BEOL wiring portion to form a metallic structure surrounding the active area of the semiconductor article in the BEOL wiring portion.

14. The semiconductor article of claim 12 wherein the guard ring is limited to the BEOL wiring portion.

15. The semiconductor article of claim 12 wherein the guard ring comprises a metallic material selected from the group consisting of copper, aluminum and alloys and mixtures thereof.

16. A method of forming a semiconductor article comprising the steps of:
(a) providing a semiconductor base portion comprising a semiconductor material;
(b) forming a back end of the line (BEOL) wiring layer comprising a metallic material and a dielectric material and excluding a semiconductor material, the BEOL wiring layer comprising a contiguous guard ring portion which includes a plurality of via bar segments such that every two via bar segments are joined at a vertex and the angle between the every two via bar segments is less than 90 degrees, the guard ring portion having a zig-zag configuration; and
(c) repeating step (b) until a predetermined number of BEOL wiring layers have been formed into a BEOL wiring portion with each contiguous guard ring portion being formed over a previous contiguous guard ring portion to form a guard ring extending through the entire BEOL wiring portion, the guard ring portion on each BEOL wiring layer having a zig-zag configuration.

17. The method of claim 16 wherein the zig-zag configuration is defined as a series of the via bars arranged in short, sharp angles in alternate directions.

18. The method of claim 16 further comprising at least one BEOL wiring layer without a contiguous guard ring portion between adjacent BEOL wiring layers having a contiguous guard ring portion.

19. The method of claim 18 further comprising a via extending through the at least one BEOL wiring layer and connecting the contiguous guard ring portions in the adjacent BEOL wiring layers.

* * * * *